United States Patent
Chuang et al.

(10) Patent No.: US 12,340,969 B2
(45) Date of Patent: Jun. 24, 2025

(54) ELECTRON GUN AND ELECTRON MICROSCOPE

(71) Applicants: KLA Corporation, Milpitas, CA (US); National Institute of Advanced Industrial Science and Technology, Tokyo (JP)

(72) Inventors: Yung-Ho Alex Chuang, Cupertino, CA (US); Yinying Xiao-Li, San Jose, CA (US); Edgardo García Berríos, San Jose, CA (US); John Fielden, Los Altos, CA (US); Lavinia Ghirardini, San Jose, CA (US); Masayoshi Nagao, Ibaraki (JP)

(73) Assignees: KLA Corporation, Milpitas, CA (US); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 18/122,388

(22) Filed: Mar. 16, 2023

(65) Prior Publication Data
US 2023/0298847 A1    Sep. 21, 2023

Related U.S. Application Data

(60) Provisional application No. 63/321,112, filed on Mar. 18, 2022.

(51) Int. Cl.
*H01J 37/153* (2006.01)
*H01J 37/073* (2006.01)
*H01J 37/28* (2006.01)

(52) U.S. Cl.
CPC ............ *H01J 37/073* (2013.01); *H01J 37/28* (2013.01); *H01J 2237/2812* (2013.01)

(58) Field of Classification Search
CPC .......... H01J 37/00; H01J 37/073; H01J 37/26; H01J 37/28; H01J 37/243;
(Continued)

(56) References Cited

U.S. PATENT DOCUMENTS 6,004,180 A    12/1999   Knall et al.
6,692,323 B1 *  2/2004   Moradi ................. H01J 1/3044
                                                                445/24
(Continued)

FOREIGN PATENT DOCUMENTS

JP    2005354721 A    12/2005
JP    6635510 B2       1/2020

OTHER PUBLICATIONS

Neo et al., Emission and focusing characteristics of volcano-structured double-gated field emitter arrays, 2009, J. Vac. Sci. Technol. B, 27(2), 701-704.
(Continued)

*Primary Examiner* — Jason L McCormack
(74) *Attorney, Agent, or Firm* — Hodgson Russ LLP

(57) ABSTRACT

An electron gun for an electron microscope or similar device includes a field emitter cathode having a field emitter protrusion extending from the output surface of a monocrystalline silicon substrate, and electrodes configured to enhance the emission of electrons from a tip portion of the field emitter protrusion to generate a primary electron beam. A contiguous TiN layer is disposed directly on at least the tip portion of the field emitter protrusion using a process that minimizes oxidation and defects in the TiN layer.

18 Claims, 6 Drawing Sheets

(58) Field of Classification Search
CPC ..... H01J 2237/2812; H01J 2237/06341; H01J 2237/0653; H01J 2201/30488; H01J 1/3044
USPC .......................................... 250/306, 307, 311
See application file for complete search history.

(56) References Cited

U.S. PATENT DOCUMENTS

| | | | |
|---|---|---|---|
| 6,911,767 | B2 | 6/2005 | Takai |
| 7,595,490 | B2 | 9/2009 | Zhou et al. |
| 7,960,904 | B2 | 6/2011 | Takai et al. |
| 9,966,230 | B1 | 5/2018 | Chuang et al. |
| 10,133,181 | B2 | 11/2018 | Chuang et al. |
| 10,558,123 | B2 | 2/2020 | Chuang et al. |
| 10,748,730 | B2 | 8/2020 | Chuang et al. |
| 10,943,760 | B2 | 3/2021 | Chuang et al. |
| 2004/0079892 | A1 | 4/2004 | Schneiker et al. |
| 2015/0002009 | A1 | 1/2015 | Zhang et al. |
| 2020/0118783 | A1* | 4/2020 | Chuang ................. H01J 37/073 |
| 2022/0051866 | A1 | 2/2022 | Yasuda et al. |

OTHER PUBLICATIONS

WIPO, International Search Report for International Application No. PCT/US2023/015595, Jul. 11, 2023.
WIPO, Written Opinion of the International Searching Authority for International Application No. PCT/US2023/015595, Jul. 11, 2023.
Py et al., "Double-gated microtip emitters for brighter field-emission displays," Journal of Vacuum Science & Technology A, Mar.-Apr. 2000, pp. 626-629, vol. 8, No. 2.
Kang et al., "Emission characteristics of TiN-coated silicon field emitter arrays," Journal of Vacuum Science & Technology B, Mar.-Apr. 1998, pp. 871-874, vol. 16, No. 2.
Lo et al., "Titanium nitride coated tungsten cold field emission sources," Journal of Vacuum Science & Technology B, Nov.-Dec. 1996, pp. 3787-3791, vol. 14, No. 6.
Lee et al., "Fabrication of volvano-type TiN field Emitter arrays," Journal of Vaccum Science & Technology B, Mar.-Apr. 2000, pp. 1085-1088, vol. 18, No. 2.
Nakamoto et al., "Suitability of low-work-function titanium nitride coated transfer mold field-emitter arrays for harsh environment applications," Journal of Vacuum Science & Technology B, Mar. 1, 2011, vol. 29.

* cited by examiner

ELECTRON GUN AND ELECTRON MICROSCOPE

CROSS-REFERENCE TO RELATED APPLICATIONS

This application claims priority to the provisional patent application filed Mar. 18, 2022 and assigned U.S. App. No. 63/321,112, the disclosure of which is hereby incorporated by reference.

FIELD OF THE DISCLOSURE

The disclosure relates generally to electron guns suitable for use in scanning electron microscopes, electron-beam lithography systems, and other systems suitable for reviewing and inspecting samples (e.g., photomasks, reticles, and semiconductor wafers). In particular, the disclosure relates to electrons guns that utilize cold electron field emitters, and to review and inspection systems including these electron guns.

BACKGROUND OF THE DISCLOSURE

The integrated circuit (IC) industry requires inspection tools with increasingly higher sensitivity to detect ever-smaller defects and particles whose sizes may be a few tens of nanometers (nm) or less. These inspection tools operate at high speed in order to inspect at least a large fraction of the area of a photomask, reticle, or wafer, in a short period. For example, high-speed inspections performed during IC production typically take one hour or less. More detailed high-speed inspections performed for research and development (R&D) or troubleshooting purposes may take, at most, a few hours. High-speed inspection tools scan sample surfaces using incident energy beams having pixel or spot sizes larger than the dimensions of the surface defect or particle of interest and monitor the amount of energy deflected from the sample surface, whereby surface defects or undesirable particles are detected by small changes in the amount of deflected energy. High-speed inspection is most commonly performed in production using inspection tools operating with ultraviolet (UV) light sources. More detailed high-speed inspection performed in R&D may be performed using electron guns.

After a defect or particle has been found by high-speed inspection, it is often necessary to make a higher resolution image and/or to perform material analysis to determine the origin or type of the particle or defect. This process is commonly called review. Review is usually performed with a scanning electron microscope (SEM). Review SEMs used in semiconductor manufacturing are typically required to review many thousands of potential defects or particles per day, whereby review SEMs are required to operate at speeds that allow, at most, a few seconds to operably scan each defect/particle.

Electron microscopes (e.g., SEMs) utilize electron guns (i.e., electron sources) to generate and direct electron beams toward target samples. Thermionic sources usually include a cathode made of tungsten or lanthanum hexaboride ($LaB_6$). During thermionic emission, electrons are boiled off the material surface when the electron thermal energy is high enough to overcome the surface potential barrier. Thermionic emitters typically require elevated temperatures (e.g., greater than 1300 K) to operate, and have several drawbacks such as inefficient power consumption, wide energy spread, short lifetime, low current density, and limited brightness.

Although thermionic sources are currently the most common type of electron gun, the demand for more efficient electron guns has driven the development of Schottky emitters and electron field emitters.

Schottky emitters are typically made of a tungsten wire having a tip coated with a layer of zirconium oxide ($ZrO_x$), which exhibits a much lower work function (~2.9 eV) than conventional thermionic emitters. Schottky emitters exhibit enhanced thermionic emission by effective potential barrier lowering due to the image charge effect under an applied external electric field. However, thermally assisted Schottky emitters need to be operated at high temperature (>1000 K) and high vacuum (~$10^{-7}$ Torr) and have wider than desirable electron emission energy spread due to the high operating temperature. Therefore, as IC feature sizes (and, hence, defect/particle of interest sizes) continue to shrink, Schottky emitters fail to provide an electron gun with the lower energy spread, higher brightness (radiance), and higher current density that is desirable for semiconductor wafer and mask inspection, review, and lithography.

Electron field emitters (referred to herein as "field emitters") typical have a conical emitter tip (cathode), a circular gate aperture, and an anode disposed in a vacuum. During operation, a potential difference is established across the emitter cathode, gate, and anode under an applied external field, resulting in high electric field at the surface of the tip. Field emission takes place when the applied electric field is high enough to reduce the potential barrier on the tip-vacuum interface so that electrons can tunnel through this barrier at room temperature and travel through the gate aperture toward the anode, which is biased at a more positive potential. The electrons in a field emitter are initially in internal thermodynamic equilibrium, and most of the emitted electrons escape by Fowler-Nordheim tunneling from electron states close to the emitter Fermi level. By contrast, in Schottky emitters, most electrons escape over the top of a field-reduced barrier from states well above the Fermi level.

Early field emitter design efforts concentrated on developing metallic field emitters. Among others, Spindt-type molybdenum field emitters are perhaps the most well-known metallic field emitters because molybdenum has a low resistivity (53.4 nΩ·m at 20° C.) and a high melting point (2896 K). Nevertheless, metallic emitters suffer from several disadvantages such as lack of uniformity due to metal deposition techniques, and, more severely, degradation in emission current, mainly due to oxidation.

With the advent of modern semiconductor fabrication technology, there has been investigation of semiconductor field emitters, particularly silicon field emitters. Single-crystal (monocrystalline) silicon is an attractive material for field emitters. Silicon crystals can be grown with high purity and few crystal defects. The conductivity of silicon can be altered by doping and/or applying a voltage. More importantly, silicon has a well-developed technology base.

The structure of a typical prior-art silicon field emitter is shown in FIG. 5. A silicon substrate 51 is usually n-type doped. A cone-shaped emitter 54 is formed on the silicon substrate 51, with an optional gate layer 57 attached to a dielectric layer 56, which includes one or more insulating layers. The optional gate layer 57 controls and extracts the emission current. A third electrode (i.e., the anode, not shown) faces the gate layer 57 and is separated at a distance on the order of hundreds of microns from the cathode. This is a typical silicon field emitter triode configuration. Note that without the gate layer 57, the field emitter can be used as a diode. Quantum tunneling of electrons takes place when a bias voltage is applied across the emitter structure. A large electrical field is generated on the surface of the emitter tip, and electrons are emitted from the tip. The production of cold (i.e., room temperature emission) electron guns for SEM instruments for semiconductor inspection/review/lithography instruments that use silicon field emitters of this type would address many of the issues associated with Schottky and thermionic emitters.

Even though silicon field emitters have shown promise in recent years, they are not yet commercially available. One serious problem with the use of silicon to form field emitters is that silicon is quite reactive and can be contaminated within hours, even at pressures around $10^{-10}$ Torr. Silicon readily forms a native oxide on its surface. Even in a vacuum, a native oxide will eventually form as the small amounts of oxygen and water present in the vacuum will react with the surface of the silicon. The interface between silicon and silicon dioxide has defects (due to dangling bonds) where the probability of an electron recombination is high. Furthermore, the band gap of silicon dioxide is large (about 9 eV) creating an additional barrier higher than the work function that an electron has to overcome in order to escape, even if the oxide is thin. For example, native oxide on a smooth silicon surface is typically about 2 nm thick. In some circumstances, oxidation can also change the shape of the field emitters. These problems may result in low brightness and current as well as poor stability, reliability, scalability, and uniformity, and have hindered the commercial use of silicon field emitters. Periodic flashing (i.e., temporarily raising the tip temperature) is required to remove those contaminants, during which time the system/instrument in which the cold electron gun is implemented remains unavailable for use. Collection of higher resolution images and/or performing material analysis is suspended while the tip is being flashed. This presents a problem in the semiconductor industry, where inspection, review, and lithography instruments are expected to operate continuously and stably without interruption for long periods. Accordingly, most commercially available SEM instruments utilized for semiconductor inspection, review, and lithography include electron guns that implement Schottky emitters.

Research effort has been expanded in looking for surface treatments and coatings for field emitters to improve their performance for lower turn-on voltages, higher emission current densities, lower noise, and improved stability. These treatments may include coating the emitter tips with refractory metals, silicides, carbides, and diamond, etc. However, these coating materials are usually limited by the fabrication process in forming smooth and uniform coating surfaces, and/or are often affected by the oxide layer formed on the coating surfaces, creating an additional energy barrier. For these reasons, cold electron guns that utilize coated silicon field emitters have not yet become practical.

What is therefore needed is an electron gun that overcomes some, or all, of the limitations of the prior art, and an electron microscope incorporating such an electron gun.

BRIEF SUMMARY OF THE DISCLOSURE

An electron gun is provided in a first embodiment. The electron gun includes a field emitter configured to generate a primary electron beam. The field emitter includes a monocrystalline silicon substrate having opposing first and second surfaces and including at least one integral field emitter protrusion. The field emitter protrusion has a fixed portion integrally connected to the silicon substrate and extending from the second surface to a tip portion. The field emitter also includes a titanium nitride (TiN) layer hermetically disposed at least on the tip portion of the field emitter protrusion such that, during operation, electrons leaving the monocrystalline silicon substrate through the tip portion to form the primary electron beam only pass through the TiN layer. The TiN layer includes at least 75 atomic percent TiN.

In an instance, the TiN layer includes greater than 80 atomic percent TiN.

In an instance, the monocrystalline silicon substrate can be p-type doped with a doping level less than approximately $10^{19}$ cm$^{-3}$. In another instance, the monocrystalline silicon substrate can be n-type doped with a doping level between approximately $10^{15}$ cm$^{-3}$ and approximately $10^{19}$ cm$^{-3}$. In yet another instance, the monocrystalline silicon substrate has a thickness greater than about 10 µm and is p-type doped with a doping level less than approximately $10^{14}$ cm$^{-3}$.

The electron gun can include a light source configured to illuminate the first surface of the monocrystalline silicon substrate. The light source can include one of a laser diode and a light emitting diode configured such that an emission current of the primary electron beam is controllable in proportion to an amount of light transmitted from the light source into the monocrystalline silicon substrate.

The TiN layer can have a thickness in the range of 2 nm to 150 nm.

A portion of the TiN layer located within a radius of 100 nm from the tip portion may include less than 10 atomic percent oxygen.

A portion of the TiN layer located within a radius of 100 nm from the tip portion may include less than 10 atomic percent carbon.

The field emitter protrusion can include one of a cone, a pyramid, or a rounded whisker. The tip portion of the field emitter protrusion may have a lateral dimension of less than 300 nm. In an instance, the tip portion of the field emitter protrusion has a lateral dimension greater than 10 nm.

The field emitter protrusion can include one of a cone, a pyramid, or a rounded whisker. The tip portion of the field emitter protrusion may have a diameter less than 300 nm.

The field emitter can be configured to operate in a reverse bias mode in which a depletion layer is generated adjacent to the second surface in response to an applied electric field.

The field emitter can further include a first dielectric layer disposed on the second surface of the monocrystalline silicon substrate adjacent to the field emitter protrusion; a first conductive gate disposed on the first dielectric layer such that an edge of the first conductive gate is spaced from the tip portion of the field emitter protrusion by a non-zero distance; a second dielectric layer disposed on the second surface of the first conductive gate; and a second focusing gate disposed on the second dielectric layer such that edges of the second conductive gate are spaced from the tip portion of the field emitter protrusion by a non-zero distance. Each of the thicknesses of the first and the second dielectric layers are from 500 nm to 3 µm, and the first dielectric layer is +300 nm of a height of the field emitter protrusion.

The electron gun can include a plurality of the field emitter protrusions arranged in a two-dimensional periodic pattern. Each of the field emitter protrusion can have an associated fixed portion integrally connected to the silicon substrate and extending from the second surface to a tip portion. The TiN layer can be hermetically disposed at least on the tip portion of each of the plurality of field emitter protrusions. In an instance, the field emitter further includes a first dielectric layer disposed on the second surface of the monocrystalline silicon substrate adjacent to the plurality of the field emitter protrusions; a first conductive gate disposed on the first dielectric layer such that edges of the first conductive gate are spaced from the tip portion of each of the plurality of field emitter protrusions by a non-zero distance; a second dielectric layer disposed on the second surface of the first conductive gate; and a second focusing gate disposed on the second dielectric layer such that edges of the second conductive gate are spaced from the tip portion of each of the plurality of field emitter protrusions by a non-zero distance. Each of the thicknesses of the first and the second dielectric layers are from 500 nm to 3 µm, and the first dielectric layer is +200 nm of a nominal height of the plurality of field emitter protrusions.

An SEM is provided in a second embodiment. The SEM includes an electron gun including a field emitter configured to generate a primary electron beam, electron optics configured to de-magnify and focus the primary electron beam onto a sample, and a detector configured to detect at least one of back-scattered electrons and secondary electrons transmitted from the sample in response to the primary electron beam. The field emitter includes a monocrystalline silicon substrate having opposing first and second surfaces and including at least one integral field emitter protrusion. The field emitter protrusion has a fixed portion integrally connected to the silicon substrate and extending from the second surface to a tip portion. The field emitter also includes a titanium nitride (TiN) layer hermetically disposed at least on the tip portion the field emitter protrusion such that, during operation, electrons leaving the monocrystalline silicon substrate through the tip portion to form the primary electron beam only pass through the TiN layer. The TiN layer comprises at least 75 atomic percent TiN. A portion of the TiN layer located within a radius of 100 nm from the tip portion comprises less than 10 atomic percent oxygen.

A device including an electron gun is provided in a third embodiment. The electron gun includes a field emitter configured to generate a primary electron beam. The field emitter includes a monocrystalline silicon substrate having opposing first and second surfaces and including at least one integral field emitter protrusion. The field emitter protrusion has a fixed portion integrally connected to the silicon substrate and extending from the second surface to a tip portion. The field emitter also includes a titanium nitride (TiN) layer hermetically disposed at least on the tip portion the field emitter protrusion such that, during operation, electrons leaving the monocrystalline silicon substrate through the tip portion to form the primary electron beam only pass through the TiN layer. The TiN layer comprises at least 75 atomic percent TiN. A portion of the TiN layer located within a radius of 100 nm from the tip portion comprises less than 10 atomic percent oxygen. The device can include one of a scanning electron microscope (SEM) system or an electron-beam lithography system.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
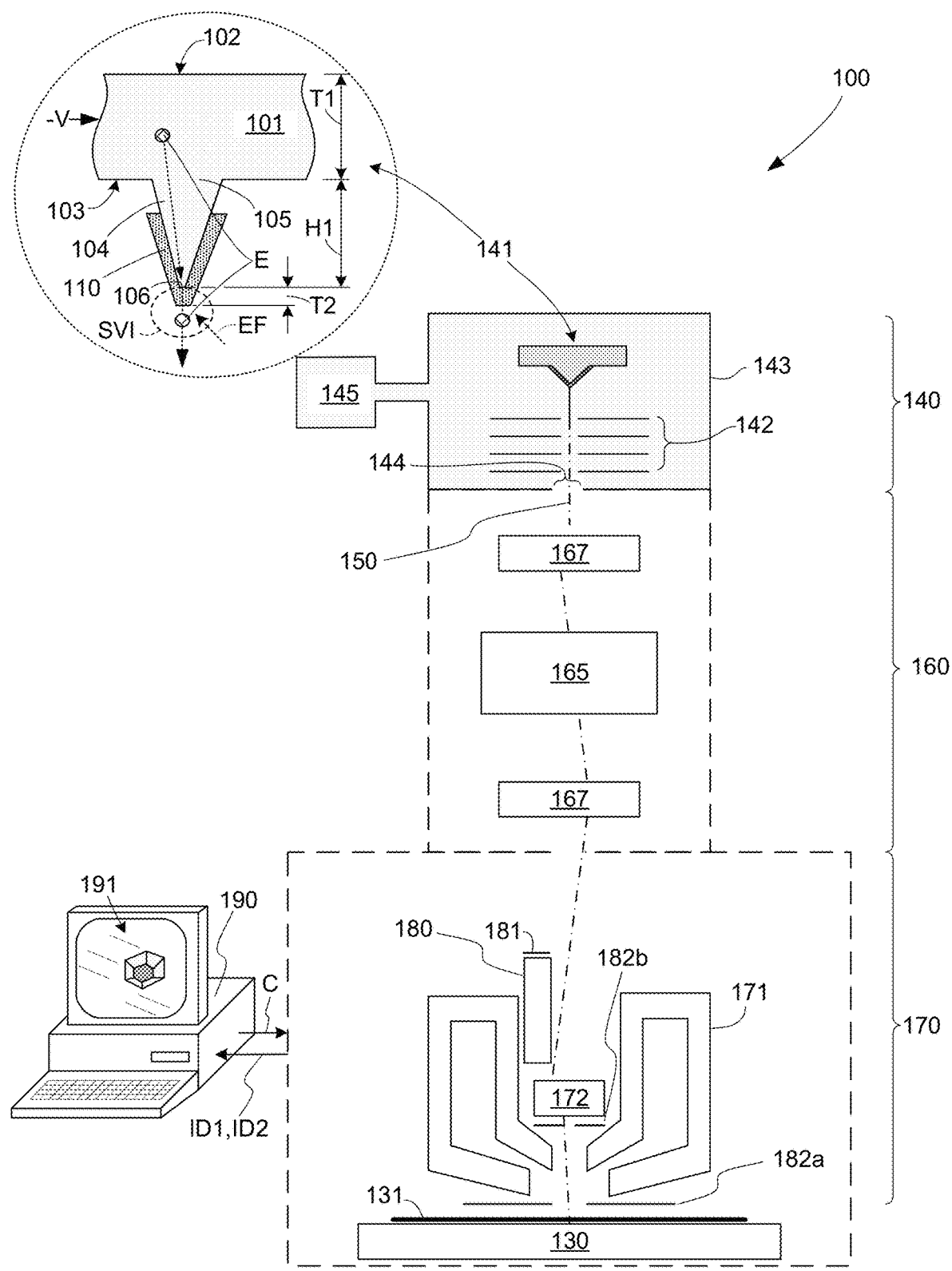
FIG. 1 illustrates an exemplary SEM incorporating an embodiment of an electron gun, electron optics, a back-scattered electron detector, and a secondary electron detector in accordance with the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein are directed to an electron gun for use in SEMs or other devices/instruments. The electron gun includes a field emitter (cathode) has one or more field emitter protrusions integrally connected to a monocrystalline (e.g., single crystal) silicon substrate such that the protrusion(s) extend from an output (second) surface of the silicon substrate. The electron gun also includes a substantially pure titanium-nitride (TiN) layer (i.e., including or consisting of at least 75% TiN) hermetically disposed on at least a tip (free end) portion of the field emitter protrusion. The TiN layer is formed on the protrusion(s) such that, during operation, electrons leaving the monocrystalline silicon substrate through the tip portion only pass through the TiN layer before forming a primary electron beam. The integral connection of the field emitter protrusion to the silicon substrate (i.e., by way of etching portions of the single crystal silicon substrate such that a remaining unetched portion of single crystal silicon forms the protrusion) circumvents the silicon substrate's relatively high work function by taking advantage of the field enhancement generated when the substrate is subjected to an applied external electric field that is strong enough to reduce the potential barrier outside the tip portion, whereby electrons are able to tunnel through the reduced potential barrier (i.e., by way of quantum-mechanical tunneling). Moreover, the use of a contiguous substantially pure TIN layer to hermetically seal the field emitter protrusion provides several advantages over conventional surface treatments and coatings. First, various techniques are known for forming a substantially pure TiN layer as a pin-hole free coating that prevents the formation of native oxide on the output surface of the field emitter protrusion. Second, the substantially pure TIN layer has a lower bandgap than conventional coatings such as silicon dioxide, thereby increasing the flow of electrons during operation. Third, the TIN-coated silicon emitters demonstrate thermally-stable electron emission compared with non-coated silicon emitters. Thus, by producing an electron gun with a field emitter including field emitter protrusions integrally formed on a single-crystal silicon substrate and hermetically protected by a substantially pure TiN layer, the embodiments disclosed herein facilitate the production of cold electron guns having the beneficial qualities of silicon (e.g., sub-1 μm wavelength absorption, high purity/low defect material, and long electron recombination times) while avoiding the negative aspects that have previously prevented the widespread commercial production of cold electron guns that use coated silicon field emitters.

The electron gun of the embodiments disclosed herein circumvents silicon's relatively high work function by taking advantage of the field enhancement due to the field emitter protrusion. A second electrode (i.e., the anode) can be positioned facing the field emitter cathode. The anode may be made of a metal such as tungsten, molybdenum, or stainless steel. A high voltage source, typically on the order of kilovolts, can be used to generate an external potential difference between the field emitter protrusion and the anode in order to create a strong electric field near the tip of the field emitter protrusion causing electrons to preferentially move toward the emitter tip. When a high potential difference between the field emitter protrusion and anode (such as a voltage of about 1 kV or higher) is used, the anode should be about 50 μm away from the field emitter protrusion. In one embodiment, the anode is placed at least 50 μm from the emitter tip, at a positive voltage of at least 500 V relative to the field emitter protrusion. In an alternate embodiment, the anode is placed close to the emitter tip, such as a distance of about 2 μm or less, at a potential of less than 100 V positive to the emitter. Placing the anode closer to the emitter tip allows a sufficiently strong electric field to be generated from a smaller voltage, which has the advantage of minimizing back-bombardment of the emitter by highly energetic ions that can reduce the lifetime of the emitter. However, placing the anode closer to the emitter tip may require more precise alignment of the aperture in the anode relative to the emitter tip.

Field emission takes place when the applied electric field is large enough to reduce the potential barrier on the silicon-vacuum interface so that an electron can tunnel through this barrier (i.e., quantum-mechanical tunneling). The electron concentration is determined by the local doping level and potential in a semiconductor and it is possible to configure field emitters to be operated in reverse bias mode as in a p-n diode, in which a depletion layer is generated due to the high electric field at the emitter surface. The interface between vacuum and a TiN-coated, p-type doped field emitter protrusion can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of the emitter tip, and an electric current, on the order of nA to μA is produced. In another embodiment, the electric field may be kept at a slightly lower level so that the bottom of the conduction band stays just above the Fermi level and little or no emission current is generated. In this embodiment, light may be used to create electron-hole pairs. The electrons so created will be strongly attracted towards the tip and many will be emitted from the tip as an emission current. In this embodiment, the emission current may be controlled by controlling the light level incident on, or near, the field emitter substrate. In yet another embodiment, the bulk of the silicon wafer may be n-type doped, so that an abundance of electrons is available to form the emission current. The emission current density can be estimated by a modified version of the Fowler-Nordheim theory, which takes into account the field enhancement factor due to the field emitter protrusion. Thus, by producing an electron emitter structure having both a TiN layer and a field emitter protrusion formed on the single-crystal silicon substrate, the embodiments disclosed herein provide the beneficial qualities of silicon (e.g., high purity/low defect material, long electron recombination times, and mature silicon-based fabrication process), and enables the enticing features of field emitters (e.g., small emitter size, low power consumption, high brightness, high current density, high speed, and long emitter lifetime), while avoiding the negative aspects that have previously prevented the widespread commercial use of silicon-based field emitter structures.

Additional layers and structures can further enhance the beneficial qualities of the disclosed emitter structure. In an embodiment, one or several gate layers, or control electrodes, can be placed at slightly lower than the height of the field emitter protrusion (i.e., from base to tip) in order to further enhance the electric field at the emitter tip, and to achieve fast and accurate control of the emission current. The gate layer is typically formed on top of one or several insulating layers deposited on the substrate. If there are several gate layers, the insulating layers are the spacers in between these gate layers. In another embodiment, one or several gate layers, or control electrodes, are placed at slightly higher (100-200 nm) than the height of the field emitter protrusion (i.e., from base to tip) to suppress current degradation, remove electric field relaxation, and maintain high emission current when used with one or several focusing electrodes, which are placed at least 400 nm lower than the gate layers. In yet another embodiment, multiple electron-beam guns with a plurality of the disclosed field emitter protrusions can be arranged in a two-dimensional periodic pattern (e.g., a Field Emitter Array (FEA)) and can be disposed on the emitter surface for emitting electrons in the presence of an electric field.

The electron guns disclosed herein can be incorporated into inspection, metrology, and review SEMs. An SEM typically includes an electron gun, electron optics, and a detector. The electron optics can be configured to de-magnify and focus the primary electron beam onto the sample and the detector can be configured to detect at least one of back-scattered electrons and secondary electrons from the sample. The electron gun generates a primary electron beam that is directed towards a sample. The electron gun includes a TiN-coated silicon field emitter protrusion or a plurality of TiN-coated silicon field emitter protrusions. The electron gun may be configured to operate the silicon-based field emitter as a diode or a triode. The electron optics de-magnifies and focuses the primary electron beam onto the sample. The electron optics also can include deflectors that can scan the primary electron beam across an area of the sample. When the primary electron beam strikes the sample, the sample absorbs many of the electrons from the primary electron beam, but scatters some of the electrons (back-scattered electrons). The absorbed energy causes secondary electrons to be emitted from the sample along with X-rays and Auger electrons. The secondary electrons are collected by a secondary electron detector. The back-scattered electrons may be collected by a back-scattered electron detector. X-rays may be collected by an X-ray detector.

A device can incorporate an embodiment of the electron gun described herein. The device may be an SEM in which the electron optics are configured to de-magnify and focus the primary electron beam onto the sample. The device can further comprise a detector for detecting at least one of back-scattered electrons and secondary electrons from the sample. In another embodiment, the device may be an electron-beam lithography system in which the electron optics are configured to de-magnify and focus the primary electron beam onto the target. The device may further comprise a modulator for modulating the intensity of the electron beam.

FIG. 1 illustrates an exemplary inspection, metrology, or review SEM system 100 configured to inspect or review a sample 131, such as a semiconductor wafer, reticle, photomask, or other workpiece. SEM system 100 includes an electron gun 140, electron optics disposed in an upper column 160 and a lower column 170 and configured to focus and direct primary electron beam 150 to the sample 131, one or more detectors disposed in lower column 170 to detect electrons deflected from sample 131, and a computer 190.

The electron gun 140 includes a silicon field emitter (cathode) 141 and electrodes 142 disposed inside a chamber 143. The field emitter 141 is configured in a diode or triode configuration to emit electrons that travel through an applied electric field generated by electrodes 142 (which may include an anode) to form a primary electron beam 150 having a desired beam energy and beam current, usually on the order of 1 nA to 10 µA that passes through an aperture 144 out of chamber 143. The electron gun 140 may further comprise a magnetic lens (not shown). The interior of chamber 143 is maintained under high vacuum conditions during operation by a pump 145 in order to protect field emitter 141 from contaminants and to minimize bombardment by high energy ions. Adequate vacuum conditions for electron gun 140 may be maintained while allowing primary electron beam 150 to pass into upper column 160 by way of aperture 144. The vacuum pump 145 can include at least one of an ion pump and a getter pump. The aperture 144 can have a diameter between about 100 µm and about 2 mm. The aperture 144 may function as both a beam limiting aperture and a differential pumping aperture. In an embodiment, chamber 143, aperture 144 and vacuum pump 145 are collectively configured to maintain field emitter cathode 141 at a vacuum level of less than about 10-10 Torr during operation of electron gun 140.

Referring to the upper left portion of FIG. 1, field emitter cathode 141 generally includes a monocrystalline silicon substrate 101 including at least one integrally connected field emitter protrusion 104. The silicon substrate 101 is essentially defect-free and has a thickness T1 in the range of about 10 nm to about 800 µm, as measured between a flat (first) surface 102 and an opposing output (second) surface 103. In an embodiment, the silicon substrate 101 is p-type doped with a doping level less than about $10^{19}$ cm$^{-3}$. In another embodiment, the silicon substrate 101 is n-type doped with a doping level between about $10^{15}$ and $10^{19}$ cm$^{-3}$. The field emitter protrusion 104 has a fixed base portion 105 that is integrally connected to silicon substrate 101 and extends away from surface 103 to tip (free end) portion 106. In an instance, a height H1 measured in a direction perpendicular to surface 103 from base 105 to tip portion 106 is in the range from 0.5 µm to 5 µm, such as not more than about 2 µm. In one embodiment, field emitter protrusion 104 is fabricated using standard CMOS fabrication techniques by etching or otherwise removing portions of the single-crystal material forming substrate 101 (i.e., such that field emitter protrusion 104 and the remainder of substrate 101 are remaining parts of the same single-crystal structure). For example, the field emitter protrusion 104 may be formed by depositing a silicon dioxide or silicon nitride mask using plasma-enhanced chemical vapor deposition (PECVD) over surface 103 of substrate 101, then patterning the mask over a portion of surface 103 using photolithography while exposing portions of surface 103 surrounding the masked portion, and then utilizing a dry etching process (e.g., reactive-ion-etching (RIE), inductively coupled plasma (ICP) etching, or electron cyclotron resonance (ECR) etching), a wet etching process, or a combination of dry and wet etching such that portions of the single-crystal material are removed, leaving protrusion 104 surrounded by surface 103. In an embodiment, the field emitter protrusion 104 may be formed with various cantilever shapes, such as rounded whiskers (e.g., a thin cylindrical posts with a rounded apex), rounded cones, or pyramids.

In an instance, the contiguous substantially pure TiN layer 110 is hermetically disposed at least on a tip portion 106 field emitter protrusion 104 such that, during operation, electrons leaving the substrate 101 through tip portion 106 to form primary electron beam 150 only pass through contiguous substantially pure TiN layer 110 (i.e., no other materials/layers are formed on TiN layer 110 adjacent the tip portion 106). As used herein the phrase "hermetically disposed" is defined as being formed in the near absence of oxygen and forming an airtight seal on at least tip (free end) portion 106 of field emitter protrusion 104. As used herein the term "contiguous" in relation to TiN layer 110 is defined as meaning that TiN layer 110 is unbroken across a designated portion of substrate 101 that includes at least the region of tip portion 106 from which electrons are emitted. That is, the majority of the electron emission from field emitter protrusion 104 exits a region of tip portion 106 having a size, for example, on the order of tens of nm in radius, and this region is covered by TiN layer 110 in a contiguous (unbroken) manner. In other embodiments, TiN layer 110 is contiguous over a larger portion of the peripheral surface of field emitter protrusion 104 that includes tip portion 106, or may be contiguous over an even larger area including the entire peripheral surface of field emitter protrusion 104 or some or all of output surface 103 that surrounds base portion 105 of field emitter protrusion 104.

Various known techniques may be used to form contiguous substantially pure TiN layer 110. In an embodiment, TiN layer 110 is formed by reactive magnetron sputtering using 2 kW regulated power, 3.4 mTorr chamber pressure, 10/16 sccm flow rates for Ar/$N_2$ and 20 rpm turntable rotation rate. In another embodiment, TiN layer 110 is formed using the two-step rapid thermal nitridation process in an $NH_3$ ambient by which a titanium layer was thermally converted to a TiN/$TiSi_2$ bilayer. When formed using these techniques, contiguous, substantially pure TiN layer 110 circumvents silicon's oxidation problem by reliably and hermetically sealing the silicon surface against oxidation. TiN layer 110 may include various impurities, such as additional titanium atoms. Oxygen atoms may be present on any of the TiN—Si interface, the outer layer surface, or within the crystal lattice. For example, the nitride-to-titanium ratio may vary at the interface between TiN layer 110 and substrate 101. Note that TiN layer 110 may include a few atomic percent of oxygen (such as less than 10% or less than 5%) remaining at the interface between TiN layer 110 and the silicon surface of protrusion 104, but that this oxygen content likely will not significantly increase over time (such as over a time period of one year) because of the hermetic sealing. Such a low oxygen-to-silicon ratio means that there is no contiguous silicon dioxide layer at the interface, so that electrons are easily able to leave the silicon surface through the portion of TiN layer 110 covering tip portion 106. Also, such a low oxygen-to-silicon ratio means that there is no contiguous titanium oxide ($TiO_2$) layer at the interface, so that electrons are easily able to leave the TiN layer 110. Thus, TiN layer 110 can comprise, consist of, or consist essentially of 1:1 (titanium-to-nitride ratio) TiN material. Substantially pure TIN layer 110 may comprise greater than 75% 1:1 TiN material. For example, in alternative specific embodiments, TiN layer 110 may include greater than 80% 1:1 TiN material, greater than 85% 1:1 TiN material, greater than 90% 1:1 TiN material, greater than 95% 1:1 TiN material, greater than 96% 1:1 TiN material, greater than 97% 1:1 TiN material, greater than 98% 1:1 TiN material, or greater than 99% 1:1 TiN material, where all percentage values are atomic percent.

The TiN layer 110 may include less than 10% oxygen and/or less than 10% carbon, with the percentage values in atomic percent. The TiN layer 110 may include less than 5%, less than 4%, less than 3%, less than 2%, or less than 1% oxygen. Oxygen at greater than 10% in the TiN layer 110 may be problematic because $TiO_2$ and $SiO_2$ are dielectric materials that impede the emission of electrons. The TiN layer 110 may include less than 5%, less than 4%, less than 3%, less than 2%, or less than 1% carbon. These oxygen and carbon values may be measured within a radius of 100 nm from the tip portion. Higher oxygen and carbon values may occur than those listed herein or at positions farther than 100 nm radius from the tip portion. It may be possible to have a higher carbon percentage in the TiN layer 110 than an oxygen percentage with acceptable performance.

By producing electron gun 140 in the manner set forth herein, a cold electron gun with coated silicon field emitters can overcome limitations associated with conventional approaches. The integral connection of field emitter protrusion 104 circumvents the silicon substrate's relatively high work function by taking advantage of the field enhancement generated when silicon substrate 101 is subjected to an applied external electric field EF that is strong enough to reduce the potential barrier outside tip portion 106, whereby electrons E are able to tunnel through the reduced potential barrier (i.e., by way of quantum-mechanical tunneling). The resulting electron emission current density can be estimated by a modified version of the Fowler-Nordheim theory. Moreover, by forming contiguous substantially pure TIN layer 110 such that it hermetically seals tip portion 106, oxidation of the field emitter output surface is substantially and entirely prevented, thereby avoiding the significant barrier to electron escape caused by oxidation in conventional approaches. Thus, by producing electron gun 140 with a field emitter cathode 141 including protrusion 104 integrally formed on single-crystal silicon substrate 101 and hermetically protected by contiguous substantially pure TIN layer 110, a cold electron gun can have the beneficial qualities of silicon (i.e., sub-1 μm wavelength absorption, high purity/low defect material, and long electron recombination times) while avoiding the negative aspects that have previously prevented the widespread commercial production of cold electron guns that utilize coated silicon field emitters.

Referring to the central portion of FIG. 1, upper column 160 of SEM 100 includes one or more condenser lenses 165 that de-magnify the primary electron beam 150 such that an incident portion of primary electron beam 150 primarily falls within an area on an upper surface of sample 131 having a nominal diameter on the order of 20 nm or less. One or more optional deflectors 167 may be placed on one or both sides of condenser lens 165 to adjust (i.e., align, tilt and/or shift) primary electron beam 150.

The lower column 170 includes a final lens 171 configured to focus primary electron beam 150 onto sample 131 such that incident electrons strike sample 131 within the desired area, and includes various detectors 181, 182a and 182b that receive redirected electrons from sample 131. The lower column 170 also includes one or more deflectors 172 that work in combination with deflectors 167 (if present) to scan primary electron beam 150 across an area of the sample 131. In an embodiment, sample 131 is placed on a stage 130 in order to facilitate movement relative to electron gun 140 (i.e., to position different surface regions of sample 131 underneath the electron column). Incident electrons of primary electron beam 150 strike the surface of sample 131 and are deflected or otherwise scattered in directions that are determined by the struck surface features of sample 131, thereby producing secondary electrons and back-scattered electrons that move away from sample 131 (e.g., in the upward direction in FIG. 1). Secondary electrons may be collected and accelerated by electrodes 180 and directed to secondary electron detector 181 for detection. Back-scattered electrons may be detected by a back-scattered electron detectors 182a and 182b. In an embodiment, each electron detector 181, 182a and 182b is a solid-state device including at least one analog-to-digital converter that converts analog output signals generated in accordance with a number of received electrons to a digital form for transmission as one or more digital image data signals to computer 190 (i.e., image data signal ID1 generated by secondary electron detector 181, and/or signal ID2 generated by back-scattered electron detectors 182a or 182b). Computer 190 is configured to process image data signals ID1 and ID2, and is configured to generate an image 191 of the area of sample 131 over which primary electron beam 150 was scanned.

While FIG. 1 depicts the configuration and operation of an electron gun 140 integrated into an SEM 100, the electron guns disclosed herein also can be incorporated into other devices such as, for example, an electron-beam lithography system including electron optics configured to de-magnify and focus the primary electron beam onto a target, and a modulator for modulating the intensity of the electron beam.

Figure 2:
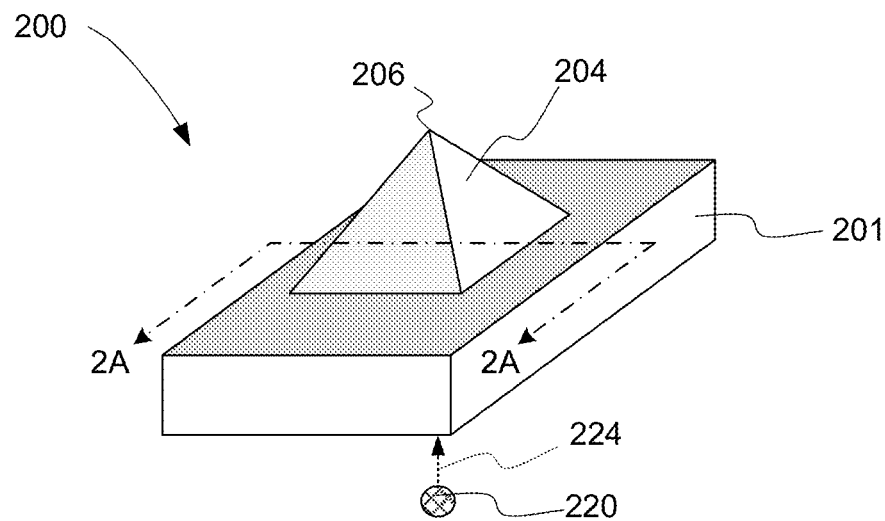
FIG. 2 is a perspective view illustrating an electron gun in a diode configuration including a TiN-coated silicon field emitter protrusion formed on a silicon substrate according to an exemplary embodiment of the present disclosure.
Figure 2A:
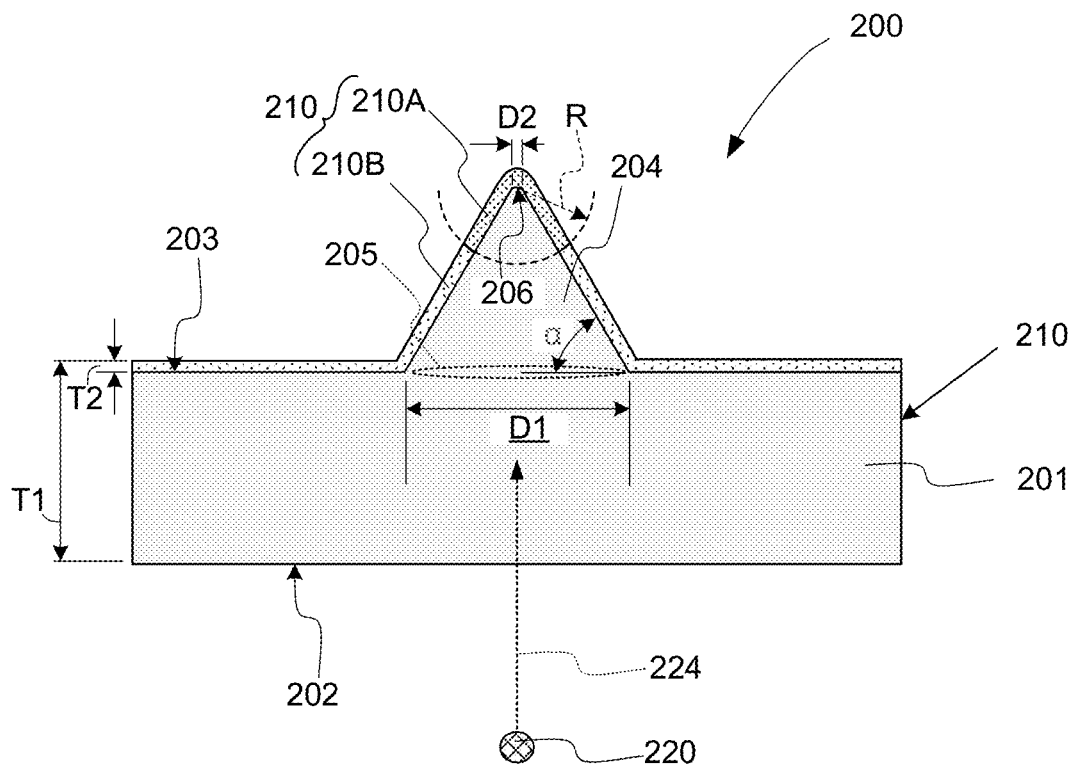
FIG. 2A is a cross-sectional view showing the electron gun of FIG. 2.

FIG. 2 illustrates in partial perspective view showing the cathode portion of an electron gun 200 including a field emitter protrusion 204 integrally connected to a substrate 201 according to an embodiment of the present disclosure, and FIG. 2A shows the cathode portion of electron gun 200 in a cross-sectional view taken along lines 2A-2A of FIG. 2. The electron gun 200 can be used in the SEM system 100 of FIG. 1. Electron gun 200 also includes electrodes such as an anode (e.g., those in electron gun 140 in FIG. 1) facing protrusion 204. The anode may be separated by a distance from about one micron and a few hundred microns from a tip portion 206 of protrusion 204. As in the previous embodiment, the field emitter cathode is formed on a silicon substrate 201 having an upward-facing output surface 203 from which field emitter protrusion 204 extends, and a contiguous TiN layer 210 disposed on output surface 203 and entirely covering field emitter protrusion 204. As indicated in FIG. 2, field emitter protrusion 204 has a pyramidal shape that can be made by anisotropic etching, which may have a slope angle α close to 54.7° (see FIG. 2A) since that angle corresponds to the intersection of the (100) and (111) planes in monocrystalline silicon. Oxidation sharpening, which may be performed at a low to moderate temperature (less than about 950° C.), may be used prior to forming TiN layer 210 when a sharp field emitter tip portion 206 is desired. The apex of the sharpened tip portion 206 may comprise, at atomic scale lengths, a substantially flat area, such as a surface substantially parallel to a crystal plane of the silicon crystal, for example substantially parallel to a (100) plane. In FIG. 2A, a characteristic lateral dimension of base region 205 is indicated by dimension D1 and that of tip region 206 is indicated by dimension D2. In an embodiment, the ratio of the lateral dimension D1 to the height H1 of the field emitter protrusion (see FIG. 3) is in a range from approximately one to about three, and diameter (or other later dimension) D2 may be in a range from approximately 10 nm to approximately 300 nm. The anode (not shown) may be made of a metal such as tungsten, molybdenum, stainless steel, or other materials. A voltage source is used to generate an external potential difference between the cathode and the anode in order to cause electrons to preferentially move toward tip portion 206 of field emitter protrusion 204. Electron gun 200 operates similarly to a typical cold electron gun in that, when a strong electric field (such as a field between about 100 V $\mu m^{-1}$ and about 10 kV $\mu m^{-1}$) is applied to tip portion 206, electrons have a high probability of being emitted from substrate 201 through the output surface 203 of the field emitter 204, most often from near tip portion 206 of the field emitter 204. As explained above, TiN layer 210 is formed using a process that hermetically seals tip 206 against oxidation. To ensure that the TiN layer 210 provides a good hermetic seal without forming a strong barrier to electron emission, the thickness T2 of the TiN layer 205 may be from approximately 2 nm and 150 nm. Even if a few percent of oxygen remain at the interface between silicon substrate 201 and TiN layer 210, no more oxygen can penetrate TiN layer 210, so no significant further oxidation may occur near the silicon/TiN interface. Since the electron emission occurs from a small region near the apex of tip portion 206, the quality of the TiN layer 210 near tip portion 206 may be important. Accordingly, a portion 210A of TiN layer 210 that is within a radius R of tip portion 206 (shown in FIG. 2A) can be formed without pinholes, where the radius is approximately equal to or greater than D2. In portions 210B of TiN layer 210 that are located outside of radius R, a few pin-holes or gaps in the coverage of the TiN layer 210 or a change in the composition of the TiN layer 210 will typically not affect the emission and can be tolerated.

The diameter D2 or other lateral dimension can be less than 300 nm. If the tip portion 206 is too blunt, then there may not be enough field enhancement for electron emission without using high voltages on an extractor electrode, which can have other effects. In an instance, the diameter D2 or other lateral dimension is approximately 100 nm.

During operation of the cathode 200, substantially all the electron emission occurs from the region of diameter D2 of the apex of the tip portion 206. Any pinhole in this region, or immediately adjacent to this region, could result in non-uniform emission or unstable emission as the work function of the surface would be different at the pinhole location than in the areas fully covered by the TiN layer 210. Thus, no pinholes may be present in the emission region of the cathode 200 in an embodiment.

In addition to being substantially pure TIN, being contiguous in the region of tip portion 206, and forming a hermetic seal as described above with reference to TiN layer 110, in an embodiment TiN layer 210 may be formed with a thickness T2 in a range from 2 nm to 150 nm, may have a uniform thickness, or may be formed with a different thickness on field emitter protrusion 204 than on the rest of output surface 203. If the thickness T2 is thinner than 2 nm, then the number of pinholes may increase, which can affect electron emission. If the thickness T2 is thicker than 150 nm, then then diameter D2 may be greater than about 300 nm and the apex may not be sharp enough.

According to an aspect of the present disclosure, silicon substrate 201 can comprise monocrystalline silicon (i.e., a single crystal of silicon) that is p-type doped with a doping level less than about $10^{19}$ cm$^{-3}$ (i.e., a resistivity of about 0.005 (2 cm or higher). Since minority carrier lifetime and diffusion length decrease with increasing dopant concentration, dopant concentrations higher than about $10^{19}$ cm$^{-3}$ may be used when the silicon is thin, such as thinner than about 1 μm, whereas when the silicon is thicker than about 1 μm, dopant concentrations lower than about $10^{19}$ cm$^{-3}$ may be used. For silicon that is thicker than a few microns, such as a thickness of 10 μm or more, lower dopant concentrations, such as less than about $10^{14}$ cm$^{-3}$, may be used to ensure long carrier lifetime and low dark current. Since electrons are a minority carrier in p-type doped silicon, one embodiment using p-type silicon electron gun 200 includes an optional light source 220 configured to shine light 224 through backside surface 202 to create electron-hole pairs within silicon substrate 201. Light source 220 can include a high-intensity light source such as a laser diode or a high brightness LED, and can have a bandwidth of approximately 20 nm or less. Light source 220 may be placed behind substrate 201 to illuminate backside surface 202 as shown or may be positioned to illuminate output surface 203 (i.e., located above substrate 201 instead of below substrate 201 as shown in FIG. 2A). When the light source 220 is placed below substrate 201 as shown, light source 220 is configured to emit a light wavelength that penetrates relatively deep into the silicon, such as a wavelength longer than about 500 nm, in order to create electron-hole pairs away from bottom surface 202 of silicon substrate 201. When light source 220 illuminates field emitter protrusion 204 from the top side, a shorter wavelength that penetrates more shallowly into the silicon, such as a wavelength shorter than about 550 nm, may be used in order to create electron-hole pairs relatively close to tip portion 206 of field emitter protrusion 204. In an embodiment, light source 220 is configured such that an emission current of the primary electron beam generated by electron gun 200 (e.g. see beam 150 in FIG. 1) is controllable in proportion to an amount of light 224 transmitted from light source 220 into silicon substrate 201.

In another embodiment, the silicon may be n-type doped with a dopant concentration of about $10^{15}$ cm$^{-3}$ or greater. For example, the silicon may be n-type doped with a dopant concentration from approximately $10^{15}$ cm$^{-3}$ and $10^{19}$ cm$^{-3}$. Silicon with n-type doping has many electrons available in the conduction band, which may be drawn toward tip portion 206 of field emitter protrusion 204 to form the emission current. When using n-type doped silicon, the emission current may be controlled by adjusting a voltage on a gate electrode (such as an electrode within the extraction and focusing electrodes 142 in FIG. 1, or gate 307 in FIG. 3) or by adjusting the voltage difference between the anode and the field emitter cathode. When n-type doped silicon is used, the optional light source 220 may be omitted. In either case, field emitter protrusion 204 may be formed using the process described above for the formation of field emitter protrusion 104.

According to another aspect of the present disclosure, the field emitter cathode structure of electron gun 200 may be configured to operate in reverse bias mode as in a p-n diode, in which a depletion layer is generated due to the high electric field at output surface 203. The interface between vacuum and a TiN-coated, p-type doped field emitter can form a p-n junction, in which the vacuum is considered to be an n-type medium. In this case, the conduction and valence bands will bend downward at the surface. If the electric field is sufficient to bring the bottom of the conduction band below the Fermi energy level, there will be an abundance of electrons at the apex of tip portion 206, and an electric current, on the order of 1 nA to 1 μA, is produced. Field emission takes place when the applied electric field is high enough to reduce the potential barrier on the silicon-vacuum interface so that electrons can tunnel through this barrier (quantum-mechanical tunneling). The emission current density can be estimated by a modified version of the Fowler-Nordheim theory, which takes into account the field enhancement factor due to the field emitter.

According to another aspect of the present disclosure, TiN layer 210 comprises a contiguous TiN film that is disposed directly on the output surface of the field emitter. As used herein, the phrase "directly on" in conjunction with the TiN-to-silicon interface is intended to mean that there are no continuous intervening layers (e.g., oxide or $SiN_x$ layers) separating output surface 203 of the field emitter cathode and TiN layer 210 other than a possible thin layer (i.e., a few monolayers) including materials such as $TiN_x$ (x<1) and titanium silicide that may form at the Si/TiN interface. Note also that the phrase "directly on" does not preclude the presence of a small amount of oxide between some portions of the TiN and silicon. TiN layer 210 is grown on clean silicon using known techniques such that the TiN forms a pin-hole free coating on at least field emitter protrusion 204 having a thickness T2 in the range from approximately 2 nm to 150 nm, including all ranges and values to the 0.1 nm therebetween. Other sections of the coating may include pin-hole defects outside of the coating on the field emitter protrusion 204 or the coating may be entirely pin-hole free. In an instance, presence of pin-hole defects are minimized outside of the field emitter protrusion 204.

All native oxide may be removed from the silicon by, for example, a wet clean followed by an in-situ etch prior to forming TiN layer 210. An advantage of TiN layer 210 is that such a pin-hole free coating, when applied to a clean silicon surface, prevents formation of a native oxide on the output surface of the field emitter. As previously described, a silicon dioxide layer has a high band gap and even thin layers can block a significant fraction of electrons from leaving the silicon. Thus, the TiN layer 210 allows even electrons with low energies to leave the silicon field emitter protrusion 204. Formed on the silicon substrate 201, field emitter protrusion 204 circumvent limitations of previous electron emitters and the sharp emitter provides field enhancement and high emission current. In addition, previous silicon devices could not avoid a silicon dioxide interface layer from forming between the silicon and the low work-function material, even if the silicon layer was free of oxide when coated. That is, without an impervious pin-hole-free protection layer on the silicon, oxygen would eventually migrate to the silicon surface and form an oxide layer. An advantage of forming layer 210 using TiN is that even a thin pin-hole-free TiN layer is impervious to oxygen and hermetically seals the silicon. Since most of the electron emission occurs from a small region near the apex of the field emitter protrusion, the lack of pinholes may only be needed within a few hundred nm of the apex of the field emitter. Another advantage of TiN layer 210 is that the density of defects and interface traps at the silicon to TiN interface is typically lower than at the silicon-to-silicon dioxide interface leading to higher emission current.

Figure 3:
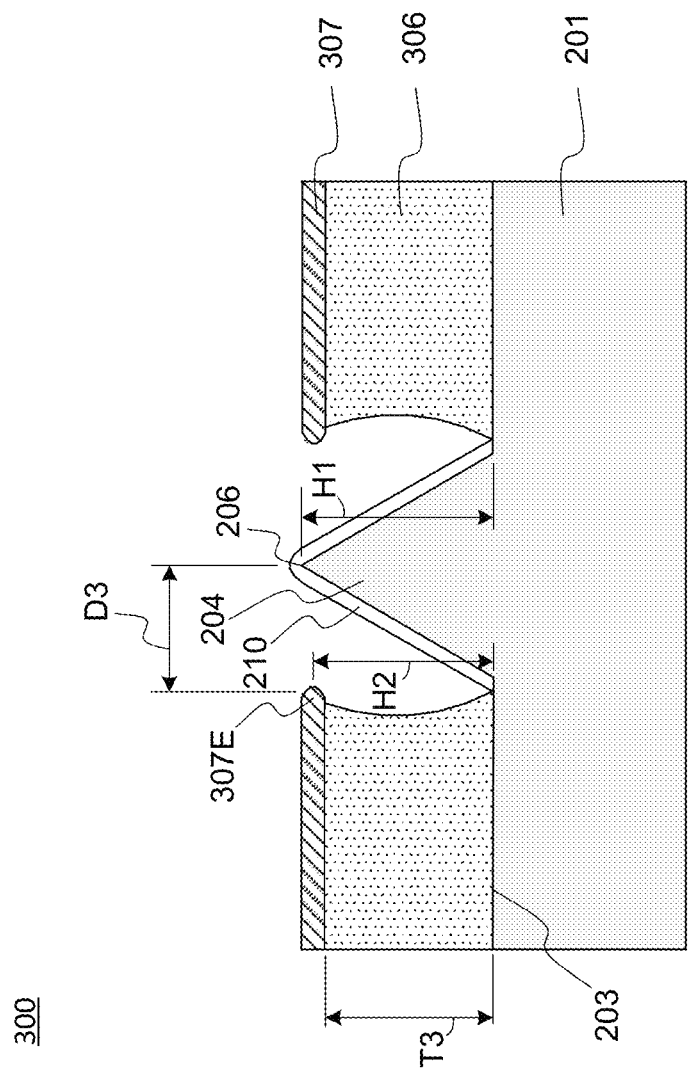
FIG. 3 is a cross-sectional side view illustrating an electron gun in a triode configuration including a TiN-coated silicon field emitter protrusion formed on a silicon substrate and a gate layer according to another embodiment of the present disclosure.

FIG. 3 illustrates, in cross section view, an electron gun 300 according to another embodiment. The electron gun 300 can be used in the SEM system 100 of FIG. 1. Similar to the structure described above in FIG. 2, electron gun 300 includes a field emitter cathode formed by a field emitter protrusion 204 integrally connected to a silicon substrate 201 and extending upward form output surface 203. Electron gun 300 includes a gate 307, or control electrode, that disposed on one or more dielectric layers 306 such that an inside edge 307E of conductive gate 307 is spaced from tip portion 206 of field emitter protrusion 204 by a predetermined distance D3. To achieve fast and accurate control of the emission current, a thickness T3 of dielectric layer 306 is controlled such that a height H2 of gate 307 is similar to height H1 of field emitter tip portion 206 (i.e., measured relative to output surface 203 located outside the periphery of field emitter protrusion 204). Thus, a thickness T3 of the dielectric layer 306 is approximately equal to or less than height H1 of field emitter protrusion 204. Thickness T3 of dielectric layer 306 may differ from height H1 of field emitter protrusion 204 by no more than a few hundred nm (e.g., such that height H2 is within a range of +300 nm of height H1). For example, thickness T3 may be chosen so that gate 307 is at approximately the same height as, or about 200 nm higher than, or about 200 nm lower than field emitter tip portion 206. Dielectric layer 306 may comprise one or more dielectric materials, such as $SiO_2$ or $Si_3N_4$. The dielectric layer 306 is disposed on the top surface of the silicon surrounding field emitter protrusion 204 but does not necessarily cover field emitter protrusion 204. In another instance, the dielectric layer 306 partly covers the field emitter. Gate 307 and dielectric layer 306 can be fabricated by standard CMOS fabrication techniques such as using PVD, CVD, or ALD deposition methods. The gate 307 may comprise a metal or polysilicon. The simplest emitter design is the triode configuration in which only one gate 307 is used, but other configurations are possible. This gate 307 is typically formed on top of dielectric layer 306, comprising one or several insulating layers, deposited on the substrate 201. Two or more gate layers (not shown) may be utilized in more complex emitter designs, where multiple dielectric layers are used as spacers in between these gate layers. Note that electron gun 300 is not limited to pyramidal or conical field emitters and may comprise any shape field emitter, such as a rounded whisker shaped field emitter or another shape. Changes or configurations different from those in FIG. 2 are possible in the embodiment of FIG. 3.

While TiN layer 210 is illustrated as only covering field emitter protrusion 204 in FIG. 3, TiN layer 205 also can extend under dielectric layer 306. For example, TiN layer 210 may be formed on output surface 203 of substrate 201 and over field emitter protrusion 204 before the formation of dielectric layer 306.

Figure 4A:
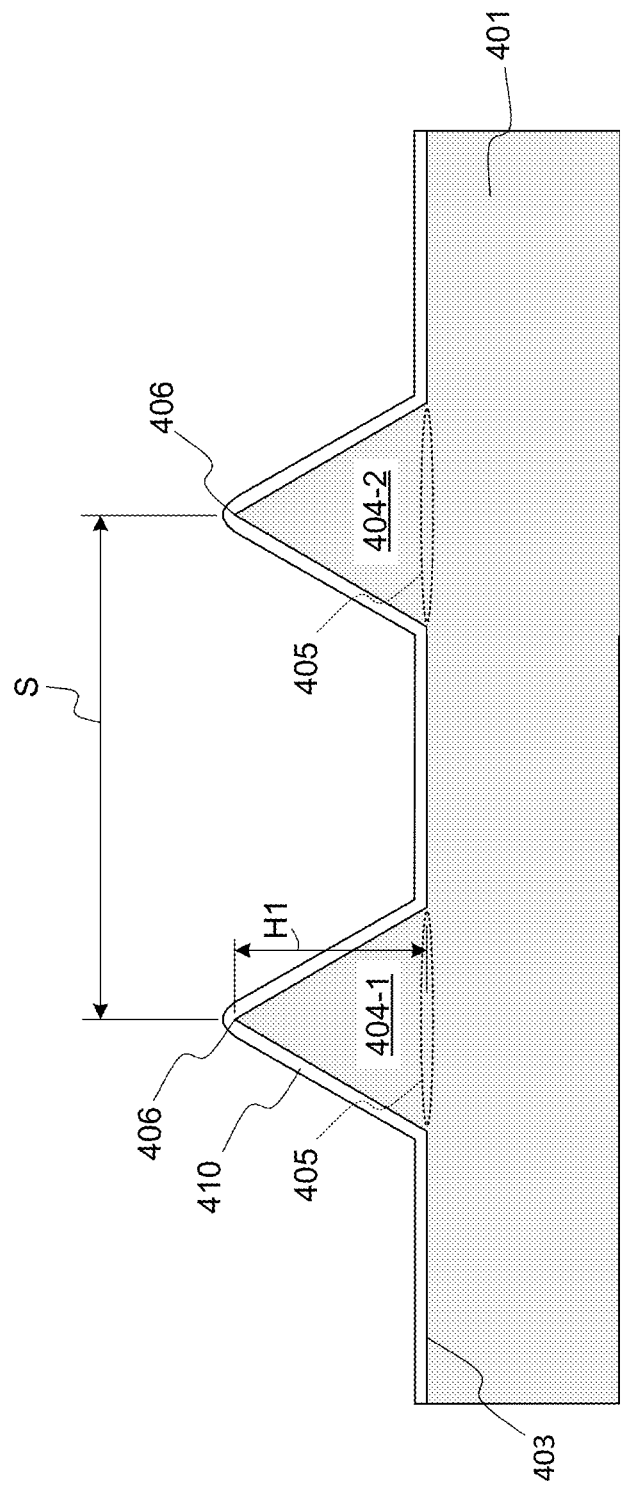
FIG. 4A and FIG. 4B are cross-sectional side view diagrams illustrating multi-electron-beam electron guns including TiN-coated silicon field emitter protrusion arrays formed on silicon substrates in diode and triode configurations according to embodiments of the present disclosure.
Figure 4B:
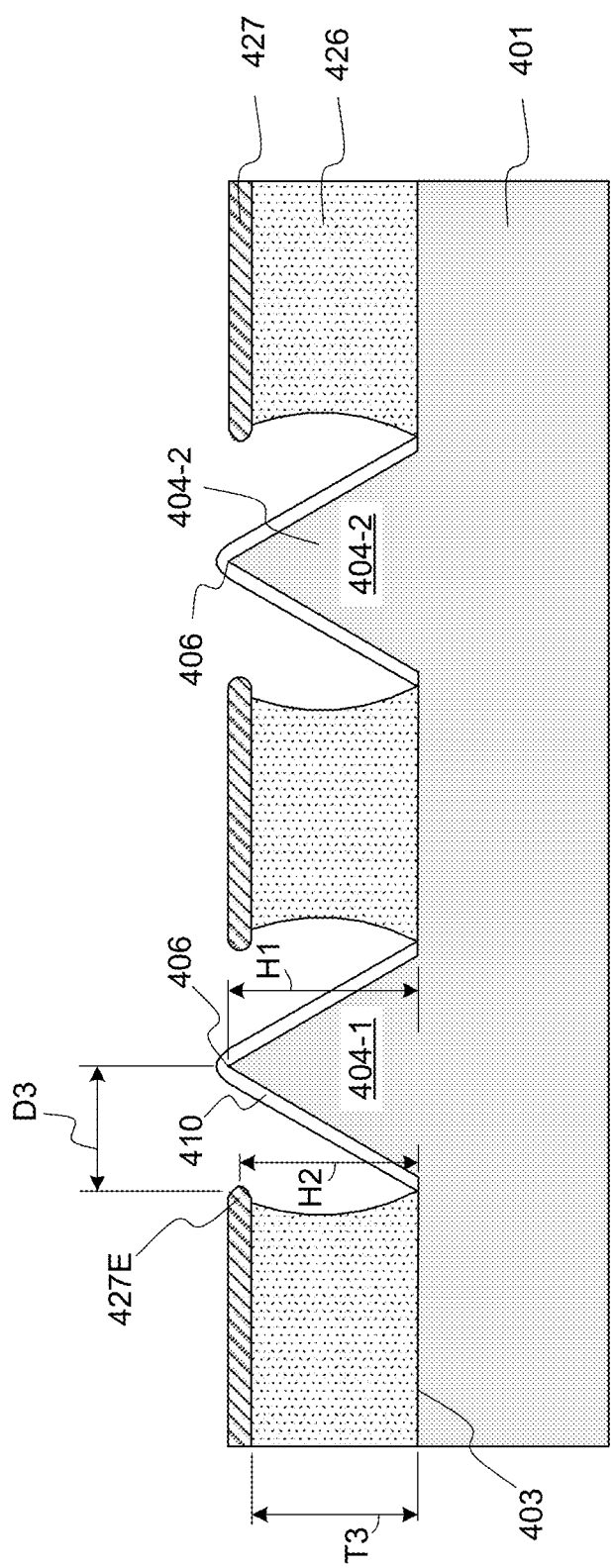
Figure 5:
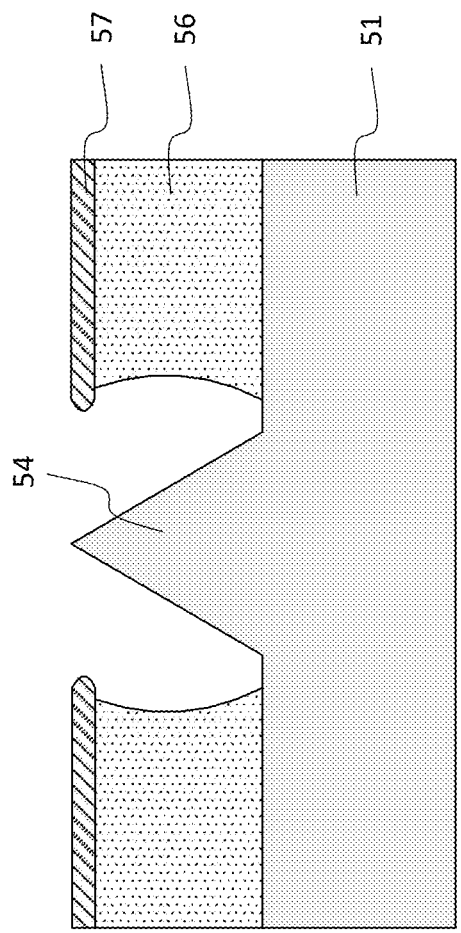
FIG. 5 is a cross-sectional side view illustrating a previous electron gun comprising a silicon field emitter.

FIGS. 4A and 4B illustrate, in cross section views, disclosed electron guns according to embodiments of the present disclosure in which additional layers and structures are utilized to further enhance the beneficial qualities of the disclosed electron gun structure. The illustrated exemplary embodiments are not intended to be exhaustive, and electron guns including combinations of the additional layers and structures described below are understood to be possible. The embodiments of FIGS. 4A and 4B may be similar to the embodiments of FIGS. 2 and 3 arranged in an array. Thus, TiN layer 410 may be similar to TiN layer 210 (described above). Note that electron guns 400A and 400B are not limited to pyramidal or conical field emitter protrusions may comprise any shape field emitter protrusion, such as a rounded whisker shaped field emitter or another shape. Changes from, or configurations other than, those shown in FIGS. 2 and 3 are possible in the embodiments of FIGS. 4A and 4B.

FIG. 4A illustrates, in a cross section view, an electron gun 400A. Electron gun 400A includes a field emitter array (FEA) cathode formed on silicon substrate 401 and an anode (not shown) facing the FEA cathode. Silicon substrate 401 has an upward-facing output (top) surface 403 with a plurality of field emitter protrusions 404-1 and 404-2 arranged in a two-dimensional periodic pattern and a contiguous TiN layer 405 disposed on the output surface 403 covering field emitter protrusions 404-1 and 404-2. Field emitter protrusions 404-1 and 404-2 have a pyramidal shape that can be made by anisotropic etching, whereby each protrusion 404-1 and 404-2 has a base portion 405 generally aligned output surface 403 and a tip portion 406. In a manner similar to the field emitter 204 described above, field emitters 404-1 and 404-2 can be fabricated by standard CMOS fabrication techniques. Oxidation sharpening, which may be performed at a low to moderate temperature (less than about 950° C.), may be used prior to forming TiN layer 410 when sharp field emitter tip portions 406 are desired. A second electrode (i.e. an anode, not shown) is positioned facing the field emitter cathode. The anode may be made of metals such as tungsten, molybdenum, and stainless steel among others. A voltage source is utilized to generate an external potential difference between the FEA cathode and the anode in order to cause electrons to preferentially move toward emitter tip portions 406. Electron gun 400A operates similarly to a typical cold electron gun in that, when positioned properly, electrons have a high probability of being emitted, from substrate 401 through the output surface 403 of the FEA, most often from near the tip portions 406 of the field emitter protrusions 404-1 and 404-2.

A parameter influencing the field emitter properties in an FEA cathode is a spacing S between adjacent field emitters 404-1 and 404-2. Closely spaced emitters reduce the field enhancement factor due to screening effects resulting in insufficient electric field penetration into the individual emitters. Hence, to minimize field-shielding effects and to optimize field emission current density, the distance between vertically aligned emitter protrusions 404-1 and 404-2, or the emitter spacing S, can be substantially large, such as on the order of tens of microns to even centimeters. In an instance, the field emitters are spaced from 100 μm to 10 cm apart, including all ranges and values to the 1 μm therebetween. For example, the field emitters may be spaced 10 μm, 50 μm, 100 μm, 200 μm, or 500 μm apart. The spacing of the emitters may be at least 3 times nominal height H1 of emitter protrusions 404-1 and 404-2. Generally, the spacing of the emitters matches the electron optics of the system that they are incorporated into. For that reason, a spacing between 100 μm and several cm may be chosen.

FIG. 4B illustrates, in a cross-section view, an electron gun 400B. Similar to the structure described above, electron gun 400B includes a field emitter array (FEA) cathode formed on a silicon substrate 401 having an upward-facing output (top) surface 403 with a plurality of field emitter protrusions 404-1 and 404-2 arranged in a two-dimensional periodic pattern, and a contiguous TiN layer 405 disposed on the output surface 403 at least over tip portions 406 of protrusions 404-1 and 404-2. Electron gun 400B differs from electron gun 400A in that it includes a gate 427 (or control electrode) disposed at a height H2 that is similar to nominal height H1 of field emitter protrusions 404-1 and 404-2 tips and attached to substrate 401 by a dielectric 426. Gate 427 allows fast and accurate control of the emission current. The dielectric layer 426 is disposed on the top surface of the silicon surrounding field emitter protrusions 404-1 and 404-2, but does not cover any portion of protrusions 404-1 and 404-2. In another instance, the dielectric layer 426 partly covers one or more of the field emitter protrusions 404-1 and 404-2. The gate 427 or dielectric layer 426 can be fabricated by standard CMOS fabrication techniques such as using PVD, CVD, or ALD deposition methods. The gate 427 may comprise a metal or polysilicon. The simplest emitter design is the triode configuration in which only one gate layer is used, but other configurations are possible. This gate 427 is typically formed on top of an insulating layer (dielectric 426), which is usually an oxide layer, deposited on the substrate. Two or more gate layers are utilized in more complex emitter designs (not shown), where insulating layers form spacers in between these gate layers. Inside edges 427E of gates 427 are respectively spaced from tip portions 406 of field emitter protrusions 404-1 and 404-2 by a predetermined distance D3.

Field emission from silicon field emitters can be described by the well-known Fowler-Nordheim tunneling. The local field at an emitter tip is enhanced by a field enhancement factor compared with the applied electric field. As the external electric field penetrates into the semiconductor, the carrier concentration in the near-surface region changes.

For a high electrostatic bias field such as $10^7$ V cm$^{-1}$, the conduction band of a p-type field emitter will be degenerate at the surface, and a depletion region, in which the Fermi level lies in the middle of the energy gap, will be created between the p-type interior and the n-type surface. This leads to a minimum concentration of electrons and holes in such region, similar to the case of a reverse-biased p-n junction.

When the cathode comprises n-type silicon, or when a cathode comprising p-type silicon is operated as a photocathode, the applied electrostatic field need only be strong enough to bend the conduction and valence bands down at the tip, but does not need to bend the conduction band below the Fermi level. With such an applied electrostatic field, few electrons will be generated spontaneously and most of the emission current will come from electrons injected into the region near the tip from the n-type silicon or from electron-hole pairs created by absorption of light.

In previous silicon field emitters, there would be, at least, a thin oxide layer on the silicon surface. This oxide, even if only about 2 nm thick, represents a substantial barrier to any electrons trying to escape. The band gap of silicon dioxide is approximately 9 eV. Such a large band gap results in a local peak in the conduction band within the oxide that is several eVs higher than the conduction band within the silicon. The TiN layer on the disclosed field emitter surface blocks oxygen or water from reaching the silicon surface and prevents growth of an oxide layer, thus enabling an efficient electron gun.

In an embodiment, this silicon field emitter is operated at a temperature close to room temperature to minimize the energy spread of the emitted electrons. In another embodiment, useful when a larger energy spread can be tolerated, the silicon field emitter is operated at an elevated temperature, such as a temperature between about 400 K and about 1000 K, in order to reduce contamination adhering to the surface of the field emitter and allow operation of the silicon field emitter in a less clean vacuum environment.

Various modifications to the described embodiments will be apparent to those with skill in the art, and the general principles defined herein may be applied to other embodiments. For example, additional electrodes may be placed close to the electron emitter to control the emission, and/or to focus and direct the emitted electrons in a specific direction. Although it is expected that that the electron guns comprising silicon field emitters disclosed herein will be particularly useful in various kinds of scanning electron microscopes and electron-beam lithography systems, it is also envisioned that these electron guns may be useful in other applications where high radiance and/or high current electron beams are required.

The electron guns and fabrication methods described herein are not intended to be limited to the particular embodiments shown and described, but are to be accorded the widest scope consistent with the principles and novel features herein disclosed.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An electron gun including a field emitter configured to generate a primary electron beam, wherein the field emitter comprises:
    a monocrystalline silicon substrate having opposing first and second surfaces and including at least one integral field emitter protrusion, the field emitter protrusion having a fixed portion integrally connected to the silicon substrate and extending from the second surface to a tip portion; and
    a titanium nitride (TiN) layer hermetically disposed at least on the tip portion of the field emitter protrusion such that, during operation, electrons leaving the monocrystalline silicon substrate through the tip portion to form the primary electron beam only pass through the TiN layer, wherein the TiN layer comprises at least 75 atomic percent TiN, and wherein a portion of the TiN layer located within a radius of 100 nm from the tip portion comprises less than 10 atomic percent carbon.

2. The electron gun of claim 1, wherein the TiN layer comprises greater than 80 atomic percent TiN.

3. The electron gun of claim 1, wherein the monocrystalline silicon substrate is p-type doped with a doping level less than approximately $10^{19}$ cm$^{-3}$.

4. The electron gun of claim 1, wherein the monocrystalline silicon substrate is n-type doped with a doping level between approximately $10^{15}$ cm$^{-3}$ and approximately $10^{19}$ cm$^{-3}$.

5. The electron gun of claim 1, wherein the monocrystalline silicon substrate has a thickness greater than about 10 µm and is p-type doped with a doping level less than approximately $10^{14}$ cm$^{-3}$.

6. The electron gun of claim 1, further comprising a light source configured to illuminate the first surface of the monocrystalline silicon substrate, wherein the light source comprises one of a laser diode and a light emitting diode configured such that an emission current of the primary electron beam is controllable in proportion to an amount of light transmitted from the light source into the monocrystalline silicon substrate.

7. The electron gun of claim 1, wherein the TiN layer has a thickness in the range of 2 nm to 150 nm.

8. The electron gun of claim 1, wherein a portion of the TiN layer located within a radius of 100 nm from the tip portion comprises less than 10 atomic percent oxygen.

9. The electron gun of claim 1, wherein the field emitter protrusion comprises one of a cone, a pyramid, or a rounded whisker, and wherein the tip portion of the field emitter protrusion has a lateral dimension of less than 300 nm.

10. The electron gun of claim 9, wherein the tip portion of the field emitter protrusion has a lateral dimension greater than 10 nm.

11. The electron gun of claim 1, wherein the field emitter protrusion comprises one of a cone, a pyramid, or a rounded whisker, and wherein the tip portion of the field emitter protrusion has a diameter of less than 300 nm.

12. The electron gun of claim 1, wherein the field emitter is configured to operate in a reverse bias mode in which a depletion layer is generated adjacent to the second surface in response to an applied electric field.

13. The electron gun of claim 1, wherein the field emitter further comprises:
    a first dielectric layer disposed on the second surface of the monocrystalline silicon substrate adjacent to the field emitter protrusion;
    a first conductive gate disposed on the first dielectric layer such that an edge of the first conductive gate is spaced from the tip portion of the field emitter protrusion by a non-zero distance;
    a second dielectric layer disposed on the second surface of the first conductive gate; and
    a second focusing gate disposed on the second dielectric layer such that edges of the second conductive gate are spaced from the tip portion of the field emitter protrusion by a non-zero distance;
    wherein each of the thicknesses of the first and the second dielectric layers are from 500 nm to 3 µm, and the first dielectric layer is +300 nm of a height of the field emitter protrusion.

14. The electron gun of claim 1, further comprising a plurality of the field emitter protrusions arranged in a two-dimensional periodic pattern, each of the field emitter protrusion having one of the fixed portions integrally connected to the silicon substrate and extending from the second surface to a tip portion, wherein the TiN layer is hermetically disposed at least on the tip portion of each of the plurality of field emitter protrusions.

15. The electron gun of claim 14, wherein the field emitter further comprises:
    a first dielectric layer disposed on the second surface of the monocrystalline silicon substrate adjacent to the plurality of the field emitter protrusions;
    a first conductive gate disposed on the first dielectric layer such that edges of the first conductive gate are spaced from the tip portion of each of the plurality of field emitter protrusions by a non-zero distance;
    a second dielectric layer disposed on the second surface of the first conductive gate; and
    a second focusing gate disposed on the second dielectric layer such that edges of the second conductive gate are spaced from the tip portion of each of the plurality of field emitter protrusions by a non-zero distance;
    wherein each of the thicknesses of the first and the second dielectric layers are from 500 nm to 3 µm, and the first dielectric layer is +200 nm of a nominal height of the plurality of field emitter protrusions.

16. A scanning electron microscope (SEM) comprising:
    an electron gun including a field emitter configured to generate a primary electron beam;
    electron optics configured to de-magnify and focus the primary electron beam onto a sample; and a detector configured to detect at least one of backscattered electrons and secondary electrons transmitted from the sample in response to the primary electron beam;

wherein the field emitter comprises:

a monocrystalline silicon substrate having opposing first and second surfaces and including at least one integral field emitter protrusion, the field emitter protrusion having a fixed portion integrally connected to the silicon substrate and extending from the second surface to a tip portion; and a titanium nitride (TiN) layer hermetically disposed at least on the tip portion the field emitter protrusion such that, during operation, electrons leaving the monocrystalline silicon substrate through the tip portion to form the primary electron beam only pass through the TiN layer, wherein the TiN layer comprises at least 75 atomic percent TiN, and wherein a portion of the TiN layer located within a radius of 100 nm from the tip portion comprises less than 10 atomic percent oxygen and less than 10 atomic percent carbon.

17. A device including an electron gun, the electron gun including a field emitter configured to generate a primary electron beam, wherein the field emitter comprises:

a monocrystalline silicon substrate having opposing first and second surfaces and including at least one integral field emitter protrusion, the field emitter protrusion having a fixed portion integrally connected to the silicon substrate and extending from the second surface to a tip portion; and a titanium nitride (TiN) layer hermetically disposed at least on the tip portion the field emitter protrusion such that, during operation, electrons leaving the monocrystalline silicon substrate through the tip portion to form the primary electron beam only pass through the TiN layer, wherein the TiN layer comprises at least 75 atomic percent TiN, and wherein a portion of the TiN layer located within a radius of 100 nm from the tip portion comprises less than 10 atomic percent oxygen and less than 10 atomic percent carbon.

18. The device of claim 17, wherein the device comprises one of a scanning electron microscope (SEM) system or an electron-beam lithography system.

* * * * *